(12) United States Patent
Lojek

(10) Patent No.: US 6,888,192 B2
(45) Date of Patent: May 3, 2005

US006888192B2

(54) MIRROR IMAGE NON-VOLATILE MEMORY CELL TRANSISTOR PAIRS WITH SINGLE POLY LAYER

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/465,718

(22) Filed: Jun. 18, 2003

(65) Prior Publication Data

US 2004/0212004 A1 Oct. 28, 2004

Related U.S. Application Data

(63) Continuation-in-part of application No. 10/423,637, filed on Apr. 25, 2003.

(51) Int. Cl.[7] .................. H01L 29/788; H01L 39/792
(52) U.S. Cl. ................... 257/315; 257/316; 257/325; 365/185.18; 365/185.25
(58) Field of Search ..................... 257/314, 315, 257/316, 318, 325; 365/185.18, 185.25

(56) References Cited

U.S. PATENT DOCUMENTS

| | | | | |
|---|---|---|---|---|
| 5,406,521 A | * | 4/1995 | Hara .................. | 365/185.25 |
| 5,487,034 A | * | 1/1996 | Inoue ................. | 365/185.18 |
| 5,761,126 A | | 6/1998 | Chi et al. ............ | 365/185.27 |
| 5,808,338 A | * | 9/1998 | Gotou ................. | 257/315 |
| 5,999,456 A | * | 12/1999 | Sali et al. ........... | 365/185.28 |
| 6,043,530 A | | 3/2000 | Chang ................. | 257/320 |
| 6,240,021 B1 | * | 5/2001 | Mori .................. | 365/185.27 |
| 6,323,088 B1 | | 11/2001 | Gonzalez et al. ...... | 438/257 |
| 6,343,031 B1 | * | 1/2002 | Murata ................ | 365/104 |
| 6,479,351 B1 | | 11/2002 | Lojek et al. ......... | 438/266 |
| 6,541,816 B2 | | 4/2003 | Ramsbey et al. ....... | 257/324 |
| 2003/0199143 A1 | * | 10/2003 | Lin et al. ........... | 438/262 |

FOREIGN PATENT DOCUMENTS

JP          11-154712          6/1999

* cited by examiner

*Primary Examiner*—Amir Zarabian
*Assistant Examiner*—Pamela E Perkins
(74) *Attorney, Agent, or Firm*—Schneck & Schneck; Thomas Schneck

(57) ABSTRACT

An arrangement of non-volatile memory transistors constructed in symmetric pairs within the space defined by intersecting pairs of word and bit lines of a memory array. The transistors have spaced apart sources and drains separated by a channel and having a floating gate over the channel characteristic of electrically erasable programmable read only memory transistors, except that there is no second poly gate. Only a single poly gate is used as a floating charge storage gate. This floating gate is placed sufficiently close to the source or drain of the device as to enable band-to-band tunneling. The floating gate is extended over the substrate to cross a word line where the floating gate is in a capacitive relation. The word line is used to program and erase the floating gate in combination with a source or drain electrode. A block erase mode is available so that the arrangement of transistors can operate as a flash memory. The single layer of poly has a T-shape, with the T-top used as the communication member with the word line and a T-base used as a floating gate. Both T-members are at the same potential. The intersecting pairs of word and bit lines resemble a tic-tac-toe pattern, with a central clear zone wherein pairs of symmetric non-volatile memory transistors are built.

11 Claims, 6 Drawing Sheets

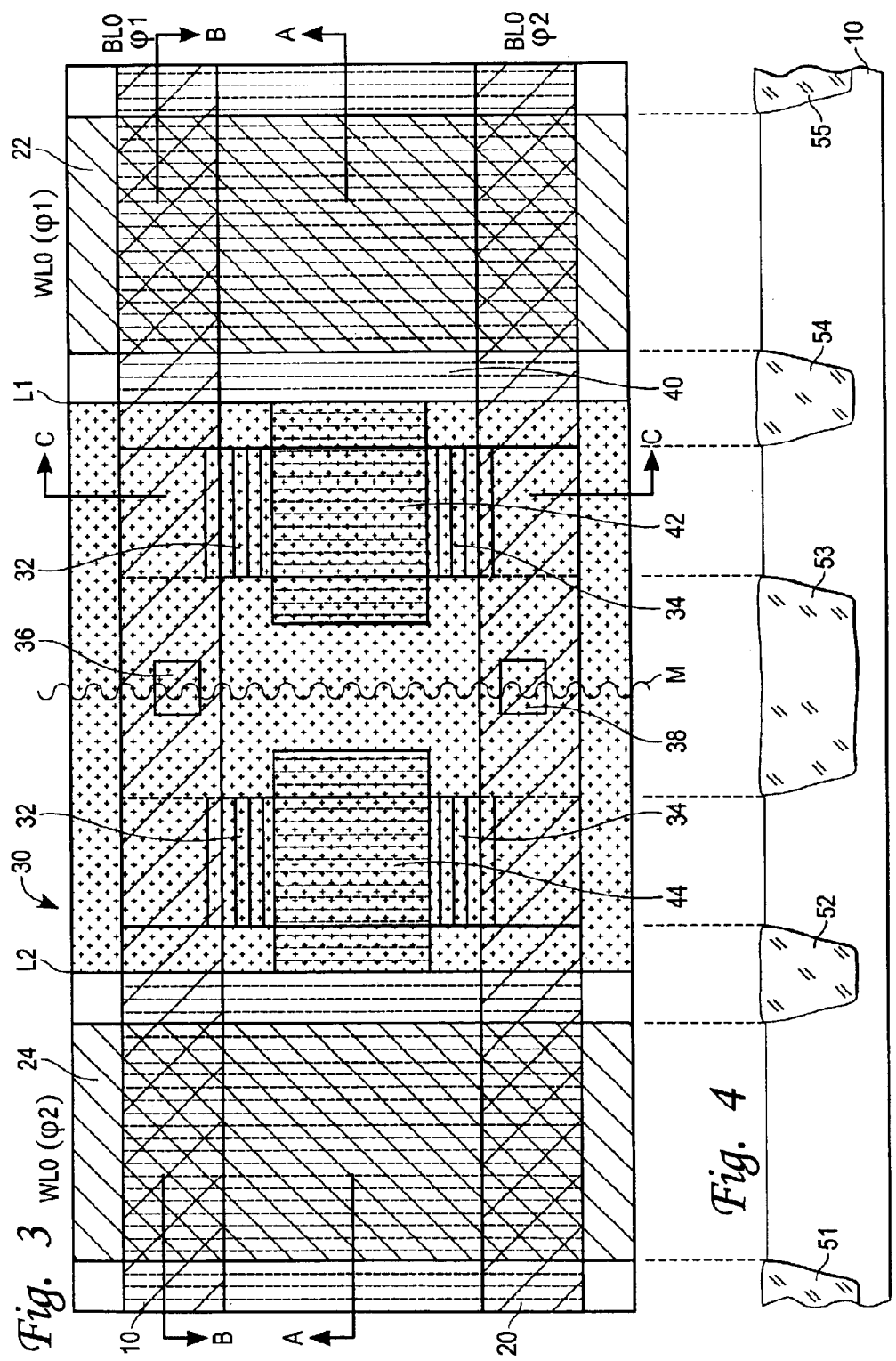

MIRROR IMAGE NON-VOLATILE MEMORY CELL TRANSISTOR PAIRS WITH SINGLE POLY LAYER

CROSS-REFERENCE TO RELATED APPLICATION

This application is a continuation-in-part of prior application Ser. No. 10/423,637 filed Apr. 25, 2003.

TECHNICAL FIELD

The invention relates to non-volatile memory transistors and, in particular, to a compact arrangement of such memory cells for an array and a method of making them.

BACKGROUND ART

In prior application Ser. No. 10/423,637 entitled "Mirror Image Memory Cell Transistor Pairs Featuring Poly Floating Spacers", assigned to the assignee of the present invention, B. Lojek described an arrangement of non-volatile MOS memory transistors for a memory array wherein symmetric pairs of transistors were built in a memory array. Transistor pairs shared a drain electrode in a common well but were otherwise completely independent. The pair was manufactured between a pair of isolation regions and so shared the same substrate region, almost as if a single transistor were constructed there.

In the prior art, single MOS floating gate transistors that stored two data bits have been devised as a way to achieve compactness. Since millions of data bits are frequently stored in non-volatile memory arrays, small savings of space are multiplied significantly over the array. In prior application Ser. No. 10/327,336 entitled "Multi-Level Memory Cell with Lateral Floating Spacers", assigned to the assignee of the present invention, B. Lojek described how two spacers, on opposite sides of a conductive gate, behave as independent charge storage regions for separate binary data, thereby allowing a single non-volatile MOS transistor to store two binary bits. Each memory cell is connected to two bit lines and one word line. The bit lines are phased so that during a single clock cycle, first one bit line is active and then the other while a word line is active for the entire cycle. In this manner, both storage areas may be accessed for a read or write operation in a single clock cycle.

In U.S. Pat. No. 6,043,530 to M. Chang, a MOS memory transistor construction is shown employing band-to-band tunneling. In U.S. Pat. No. 6,323,088 to F. Gonzalez et al., a multibit charge storage transistor addressing scheme is shown with phased bit lines.

In summary, the multibit charge storage structures of the prior art attempt to achieve good data density in a memory array without giving up valuable chip space. One of the problems that is encountered in the prior art is an amount of crosstalk between storage sites. Because the charge storage structures are so small, one charge storage location can sometimes influence another. On the other hand, separation of charge storage sites gives up chip space. The ultimate separation is one dedicated transistor for each data bit. Accordingly, an object of the invention was to provide ultimate separation for data bits afforded by dedicated transistors yet achieve the compactness of multibit charge storage structures for a non-volatile memory array.

SUMMARY OF THE INVENTION

The above object has been met with an MOS non-volatile memory transistor construction wherein a pair of memory transistors shares a common well in a semiconductor substrate for subsurface electrode formation in a memory array, whereby two compact memory transistors can be formed in place of one in most prior art arrays. This is achieved by construction of pairs of floating polysilicon memory gate transistors facing each other, with underlying channels and laterally adjacent subsurface sources and drains for each floating gate transistor. The floating gates extend back to form a capacitive relation with a word line and forward to form a band-to-band tunneling relation with the subsurface electrodes.

A non-volatile memory array described in top projection by orthogonal stripes has parallel pairs of stripes in one direction, being word lines, and pairs of stripes in the orthogonal direction, being bit lines, the intersection resembling a tic-tac-toe pattern. In the center of this pattern, the pair of MOS memory transistors is formed using only a single layer of poly for floating gate formation, with each floating gate extending from a respective word line to which it is electrically coupled. Sources and drains are symmetrically formed on opposite lateral sides of the forward portion of the poly but within the semiconductor substrate. The sources and drains are in contact with two parallel bit lines. The bit lines may be phased to provide a high electrode and a low electrode, with the transistor channel therebetween, and then reversed in polarity. The voltage between source and drain in the write mode is low, yet sufficient to generate hot electrons that are driven to the floating gate. While the sources and drains are laterally symmetric, the pair of memory transistors are symmetric about an imaginary line running across the center of the pattern, parallel to the word lines. The array is suitable for use as a flash memory.

DESCRIPTION OF DRAWINGS

FIG. 3 is a top projection of a pair of facing memory transistors illustrating construction of two adjacent symmetric memory cells in the memory array of FIG. 2.

FIGS. 4–11 are side sectional views taken along lines A—A in FIG. 3 illustrating progressive construction steps for making two adjacent symmetric memory cells.

BEST MODE FOR CARRYING OUT THE INVENTION

Figure 1:
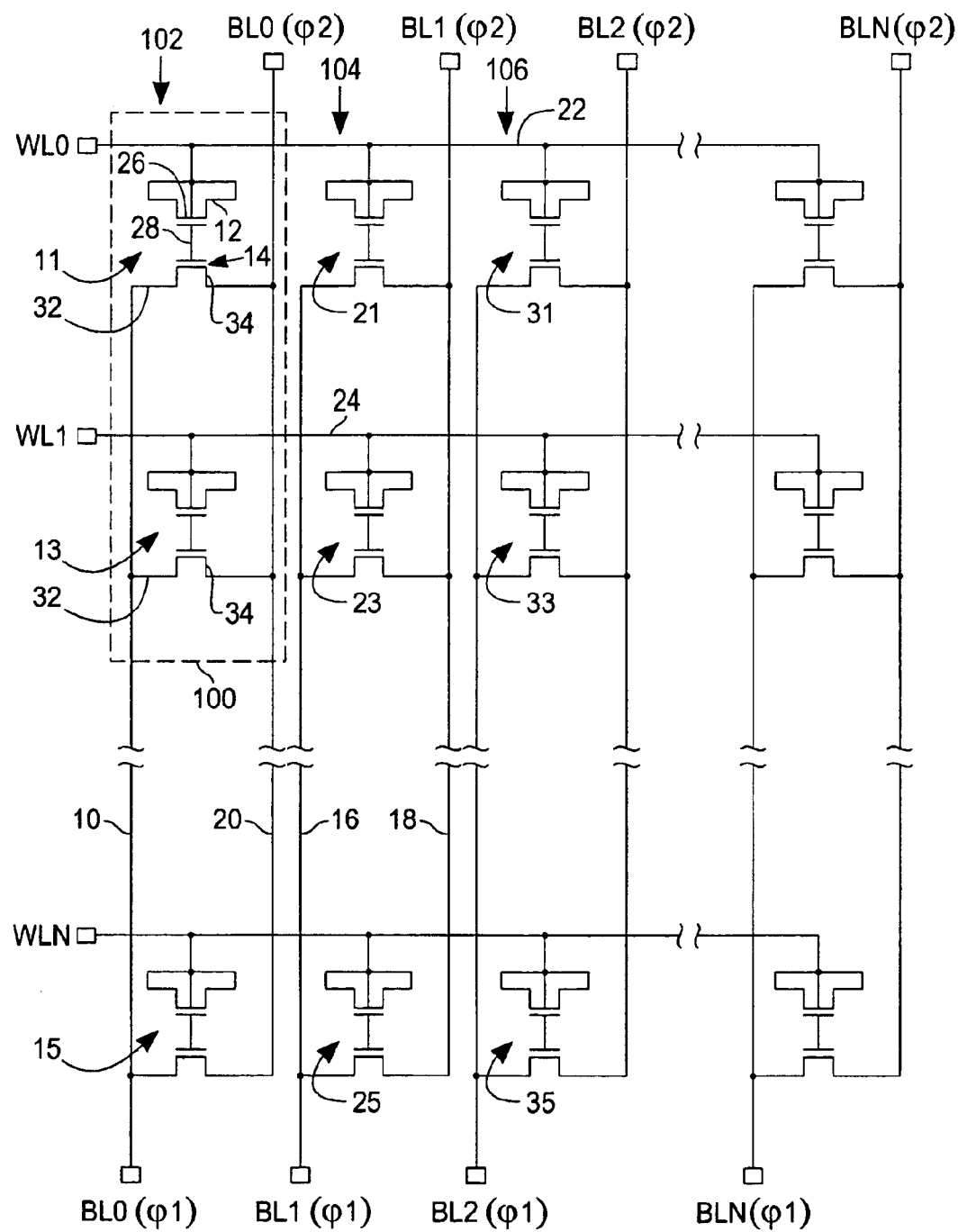
FIG. 1 is a circuit diagram of a memory array of the present invention.

With reference to FIG. 1, a MOS memory array is shown featuring a plurality of memory transistors 11, 13, 15, 21, 23, 25, 31, 33, 35, and so on. Memory transistors 11, 13 and 15 are aligned in a first column 102. Memory transistors 21, 23 and 25 are aligned in a second column 104. Memory transistors 31, 33, and 35 are aligned in a third column 106. Memory transistors 11, 21, and 31 are aligned in a first row. Memory transistors 13, 23 and 33 are aligned in a second row. Memory transistors 15, 25 and 35 are aligned in a third row, and so on. Each memory transistor, such as memory transistor 11, includes a capacitor 12 associated with a floating gate transistor 14. Each floating gate transistor in a column is connected between two bit lines, including a first bit line 10 and a second bit line 20 in the column with memory transistors 11, 13 and 15. Similarly, two bit lines 16 and 18 are associated with the next column having memory transistors 21, 23 and 25 with bit line 16 on the left side of the memory transistors and bit line 18 on the right side.

In construction, two memory transistors 11 and 13 are symmetrically built together, as explained below, in a transistor region indicated by dashed line 100. In the memory array, the two devices 11 and 13 are independent, but in construction the two devices are constructed almost like a single device, as described below.

A first word line 22 is associated with a first row of memory transistors 11, 21, 31, and so on. A second word line 24 is associated with a second row of memory transistors 13, 23 and 33. Each word line, such as the zero order word line 22, is connected to a capacitor 12 associated with memory transistor 14. Capacitor 12 is illustrated like a transistor because it is fabricated like a transistor, but with the substrate bulk or body connected to source and drain electrodes, using processes to define a capacitor plate 26 which, with an extension, explained below, forms gate 28 of transistor 14. Gate 28 is a floating gate, i.e. a charge storage structure where charge, or lack of charge, is indicative of the state of the transistor. A sense amplifier, associated with each word line, not shown, is used to read the state of the floating gate. Each charge storage transistor can be addressed individually using row and column decoders, not shown, connected to sense transistors. Source 32 of transistor 14 is connected to the zero order bit line with phase one, 10, while drain 34 is connected to the zero order bit line with phase two, 20. Phasing of the bit lines in optional. Other voltage application schemes are known in the art.

Figure 2:
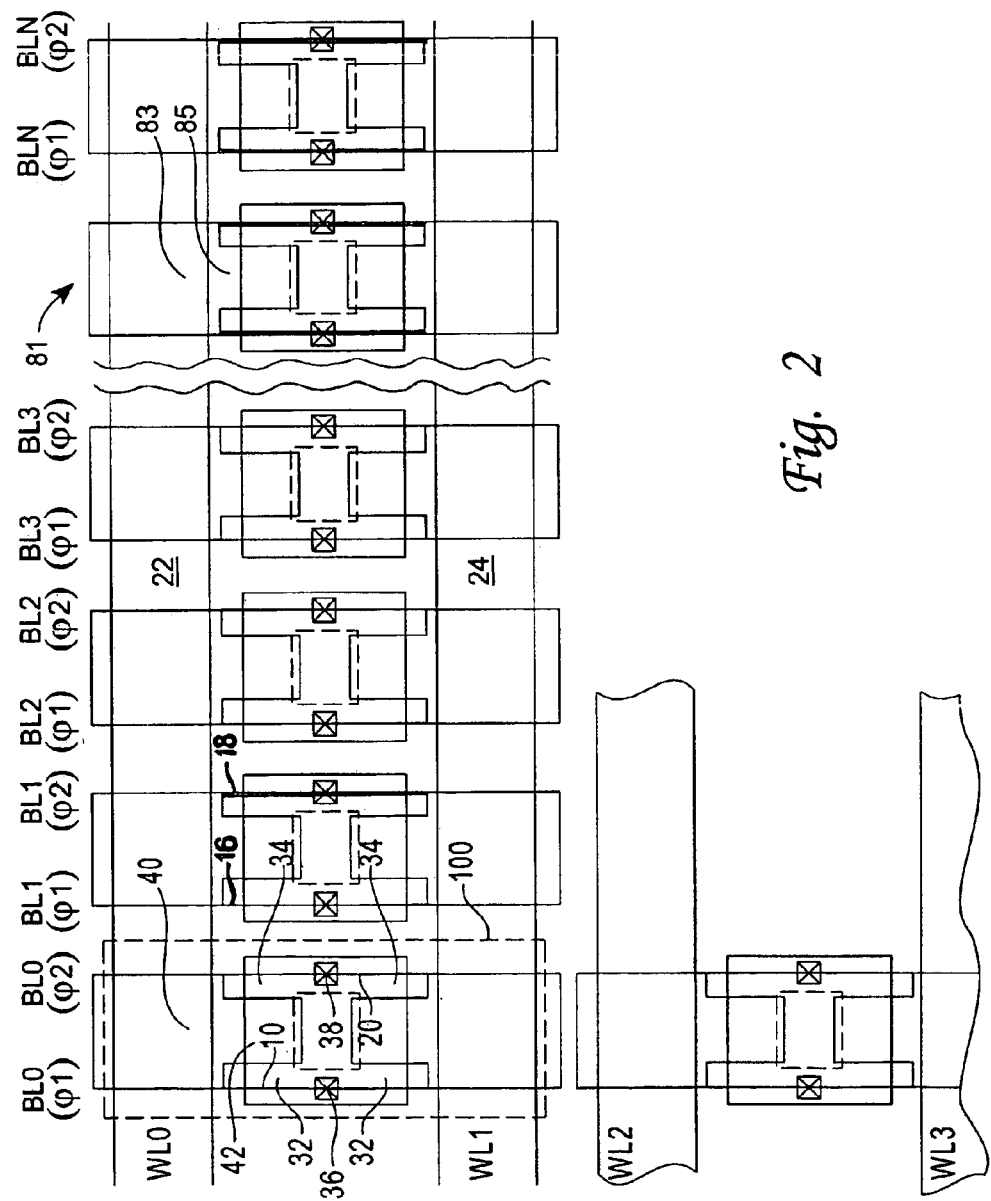
FIG. 2 is a top projection of non-volatile memory cells in the memory array of FIG. 1 schematically illustrating layout of memory transistors in the array.

In FIGS. 2 and 3, active regions of devices are shown, with FIG. 2 showing an array and FIG. 3 showing the top projection within dashed line 100 of FIG. 2 and of FIG. 1. Regions outside of the active regions are separated by isolation techniques, such as shallow trench isolation (STI), LOCOS oxidation, or similar techniques.

In a wafer p-substrate a first n+ implant into the substrate establishes all of the word lines as parallel stripes, shaded by forward diagonal lines, including first word line 22 WLØ (ϕ1) and second word line 24 WLØ (ϕ2). The word lines are co-extensive with the width of the array. Between lines L1 and L2 an n-well implant is made, defining a region 30, shaded by regular stippling, where two symmetric memory transistors will be built. This implant has an almost square shape with a length approximately twice the length of each of the two memory transistors that are mirror-image symmetric relative to an imaginary line M, shown as a wavy line, joining contacts 36 and 38. The approximate size of this square is 2×2 microns on a side, depending upon equipment and process technology used. The contact regions 36 and 38, in the middle of the bit lines shown in the construction region defined by dashed line 100, are places where metal plugs will contact the surface of the substrate so that electrical communication is had with implanted subsurface source and drain regions 32 and 34 shaded as solid horizontal lines. These are perpendicular to the word lines 22 and 24, making contact with bit lines 10 and 20, having a length co-extensive with columns of the memory array. To repeat, each of the bit lines 10 and 20 has associated implanted source and drain regions, forming source and drain electrodes 32 and 34, respectively, for transistor 14, with similar implanted electrodes for its mirror-image partner, transistor 30. Thus far, no structures are over the substrate, except that a layer of oxide is grown over the substrate.

Each memory cell has a T-shaped deposit of polysilicon over the oxide covering the substrate, most clearly seen in FIG. 2. In FIG. 3, the T-shape is shaded with short parallel segments, with each poly deposit having a T-base 42 in both FIGS. 2 and 3, and a T-top 40 superposed over the word line. The T-top 40 is a stripe deposit parallel to the word line 22 and is generally superposed over the word line 22 orthogonal to bit lines 10 and 20. In FIG. 2, at the right side of the drawing, a single poly T-shape layer 81 is seen to have a T-top 83 and a T-base 85. As previously mentioned, the T-base 42 has an underlying oxide layer spacing the T-base 42 from the substrate, with source 32 and drain 34 on opposite lateral sides of the T-base. The T-top acts in capacitive relation with the underlying word line, conducting during forward bias conditions.

Two symmetric memory transistors are built in N-well region 30, namely transistors 11 and 13 seen in FIG. 1, with the two transistors mirrored across an imaginary line M in FIG. 3 which is parallel to two adjacent word lines and midway therebetween. Returning to FIG. 1, the two transistors have sources 32 and drains 34 which are implanted into the N-well after the T-base is constructed, so that sources and drains are self-aligned with the poly T-base. The two transistors are symmetric about an imaginary line M passing through the midpoint between the two facing T-bases in the direction of a line drawn through contact regions 36, 38. Perfect geometric symmetry is not essential nor attainable, but preferred as a design objective because it facilitates mask design and fabrication processes.

With reference to FIG. 4, substrate 10 is seen having shallow trench isolation (STI) regions 51–55 for two facing memory cells, including the transistors proximate to T-base 42 and T-base 44 in FIG. 3, with supporting word and bit lines. These STI regions are boundaries or walls that define active areas as regions between STI boundaries and are formed after the initial doping of the substrate. The remaining figures show a sequence of important steps in formation of the devices. Steps of lesser importance, or steps well-known to those skilled in the art are not shown.

Figure 5:
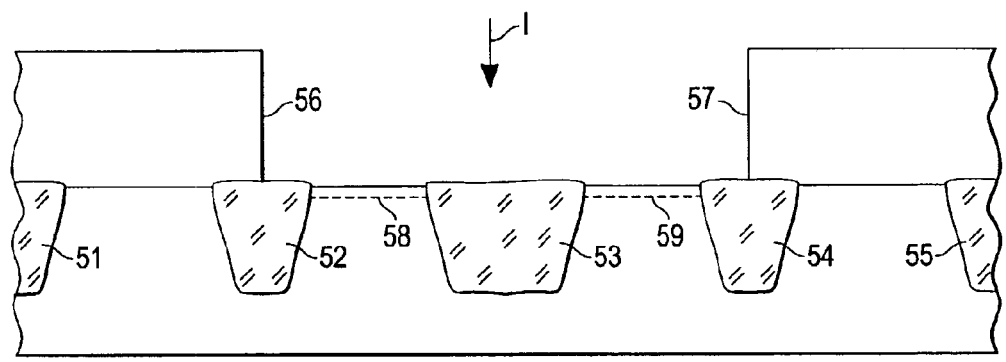
Figure 6:
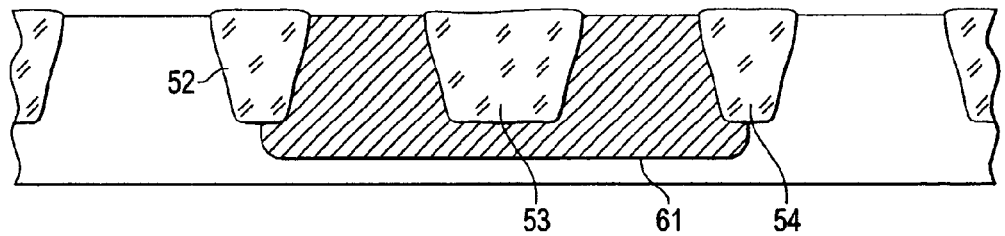

In FIG. 5, N-well photomask portions 56 and 57 are placed over left and right zones of the two facing memory cells, leaving open a central zone between the marks so that an ion beam, I, can deliver negative ions implanted in regions 58 and 59. In FIG. 6, the implant has been driven into the substrate such that the depth of N-well 61 extends at least to the depth of trench 53 and extends between trenches 52 and 54. At this depth, the N-well can be shared by two symmetric memory transistors, with one to be built on each side of isolation region 53. At the same time photomask portions 56 and 57 have been removed.

Figure 7:
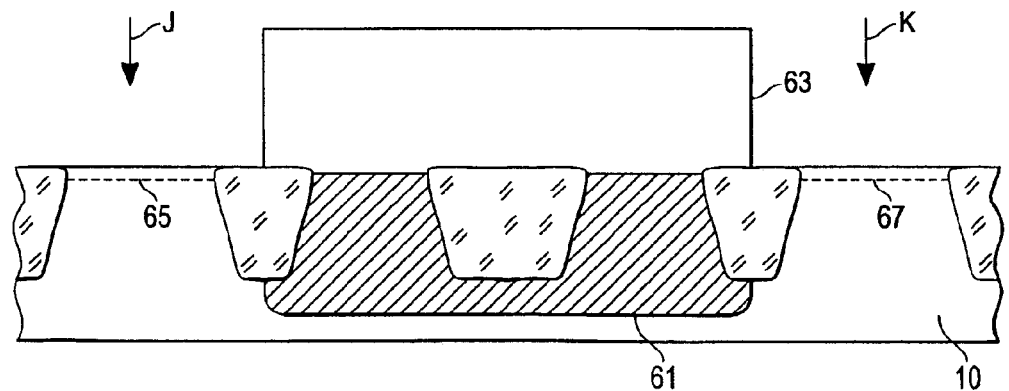
Figure 8:
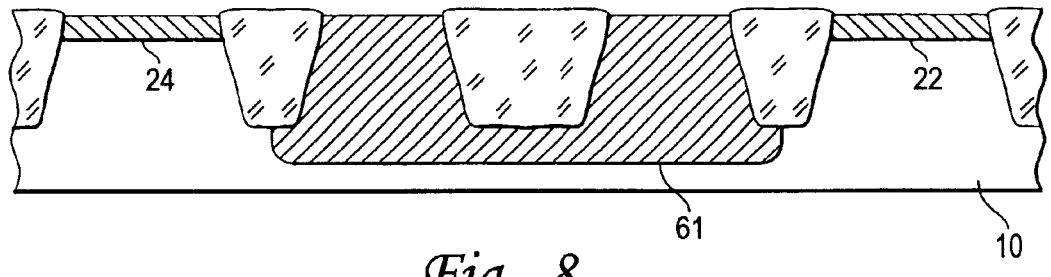
Figure 9:
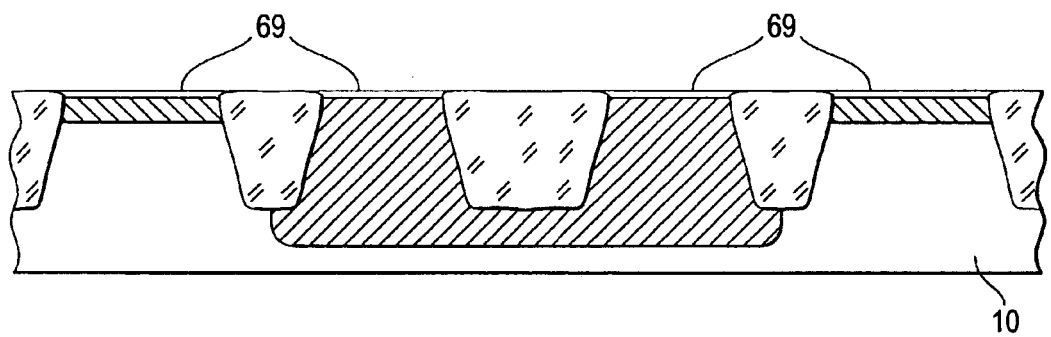
Figure 10:
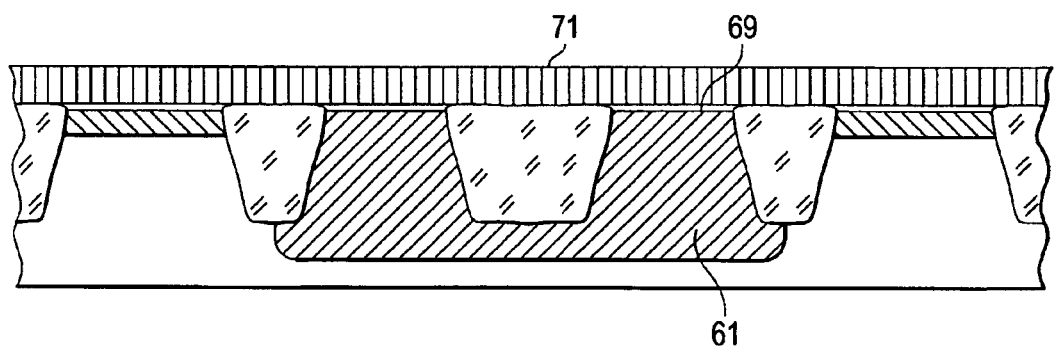
Figure 11:
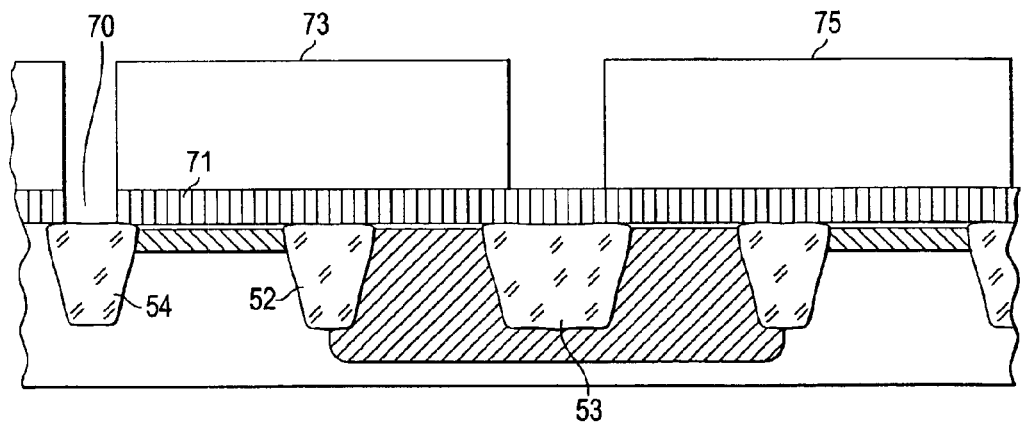

In FIG. 7, a photomask 63 is applied over the N-well and ion beams J and K deliver a concentration of negative ions into regions 65 and 67 for establishing word lines 24 and 22 in FIG. 3. In FIG. 8, the implanted regions are driven in so that word lines 24 and 22 are seen in the p-substrate 10. The word lines are linear, running across the width of the memory array, as seen in FIG. 2. Active regions of the substrate are covered with gate oxide 69 to a thickness of 50–80 Angstroms, as seen in FIG. 9. The gate oxide layer 69 will insulate the n-well 67 and its contents from a polysilicon layer 71, seen in FIG. 10, having a thickness of 1500–2000 Angstroms. The poly layer 71 behaves as one plate of a capacitor, as previously mentioned. The second plate of the capacitor is the associated word line. This is a T-top region of the poly. The poly region furthest from the word line is the T-base region, forming the floating gate of a transistor with nearby source and drain in the substrate. Later, the poly layer 71 is masked, as seen in FIG. 11 where mask regions 73 and 75 protect the polysilicon except over the central isolation region 53 and also where transistors are separated, as in region 70. Polysilicon is etched above the central isolation region so that two separate symmetric memory transistors can be formed sharing the same N-well.

Figure 12:
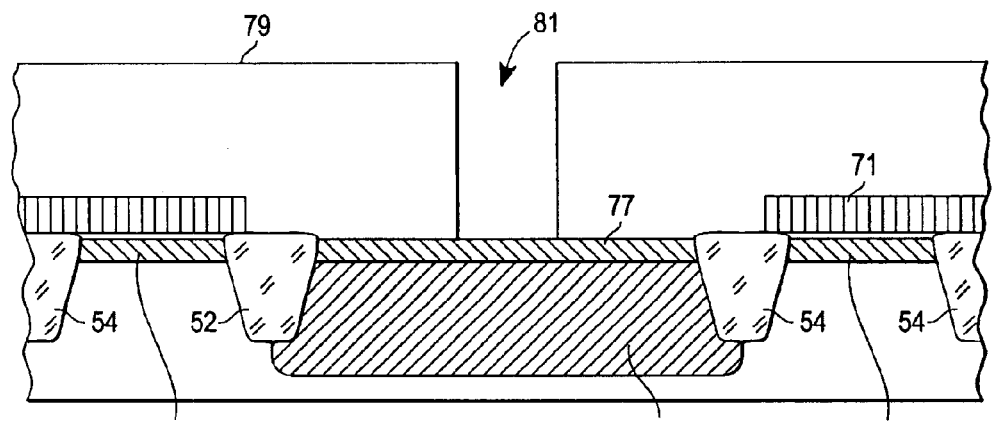
FIG. 12 is a side sectional view taken along lines B—B in FIG. 3 illustrating construction steps for making two adjacent symmetric memory cells.
Figure 13:
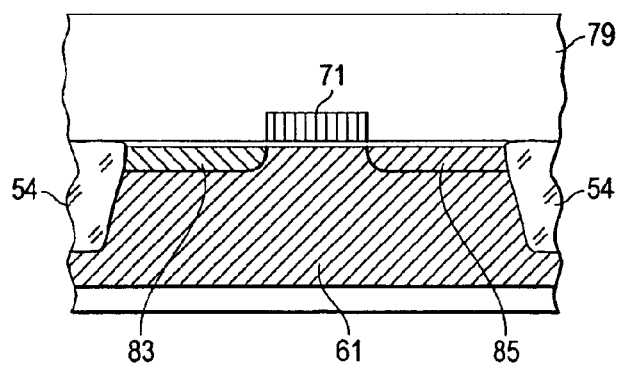
FIG. 13 is a side sectional view taken along lines C—C in FIG. 3 illustrating construction of a single memory transistor having a single poly layer.

Switching to the sectional view of FIG. 12 (along lines B—B of FIG. 3) it is seen that the single polysilicon layer 71 is etched back to the region of isolation trenches 52 and 54. Also seen for the first time is a p+ doping region 77 in the N-well forming source and drain electrodes of a memory transistor which is connected to bit line 10 in FIG. 3. A deposition of inter-layer dielectric material 79 (ILD) is placed over poly 71 with a central opening 81. This opening will be used for a metal plug to make contact with the bit line. The metal filler is shown as contact 36 in FIG. 3. In the transverse sectional view of FIG. 13 the polysilicon region 71, a floating gate, is the T-base 42 in FIG. 3. The floating gate is spaced between two p+ diffusions or implants 83 and 85 in the N-well 61. Recall that the T-base region is spaced from the substrate by gate oxide and is, therefore, electrically floating. The source and drain regions 83 and 85 extend laterally away from the T-base region toward the bit lines 10 and 20 seen in FIG. 3. Thus, the bit lines bias control conduction in the channel by setting the threshold voltage. Voltages on the source and drain can bias junctions to induce band-to-band tunneling relative to the floating gate. Charge accumulations trapped on the floating gate indicate a memory state. The bit line is used to sense the state of charge of the floating gate. Band-to-band tunneling occurs partly because of the small dimensions of the cell and appropriate concentration of dopants in regions 83, 85 and 61. The channel length is approximately 0.25–0.35 microns, while the distance between STI regions 54 are defined by minimum design rules of whatever processing technology is used. In this tight environment, holes in the source or drain become sufficiently energetic to cause electrons to be pulled from the floating gate. Alternatively, hot electrons can be placed on the floating gate with an opposite bias.

In this application, the invention was described with reference to a p-substrate with an N-well. These polarities could have been reversed.

In operation, relatively low voltages may be used to program the memory transistors, such as 2.5V. High voltages, such as 5V may be used in the interior of the chip. Note that the left and right bit lines are not held at the same voltage for program and erase, but are phase alternates relative to ground. Phase alternating allows the two mirror-image transistors to share the same source and drain. Examples of voltages are as follows:

|        | PROGRAM  | READ (ROW) | BLOCK ERASE   |
|--------|----------|------------|---------------|
| BL0 (L)| +5 V     | +2.5 V     | −5 V          |
| BL0 (R)| Floating | 0 V        | −5 V          |
| WL0    | +5 V     | 0 V        | +2.5 V to +5 V|
| N-WELL | +5 V     | +3 V to +5 V| 0 V          |
| P-SUBS | 0 V      | 0 V        | 0 V           |
| BL1 (L)| +5 V     |            | −5 V          |
| BL1 (R)| Floating |            | −5 V          |
| WL1    | 0 V      |            | +2.5 V to +5 V|
| N-WELL | +5 V     |            | 0 V           |
| P-SUBS | 0 V      |            | 0 V           |
| BLN (L)| 0 V      | +2.5 V     | −5 V          |
| BLN (R)| 0 V      | 0 V        | −5 V          |
| WLN    | 0 V      |            | +2.5 V to +5 V|

-continued

|        | PROGRAM | READ (ROW)   | BLOCK ERASE |
|--------|---------|--------------|-------------|
| N-WELL | 0 V     | +3 V to +5 V | 0 V         |
| P-SUBS | 0 V     | +3 V         | 0 V         |

Note that the voltages for block erase and erase are the same except that in block erase, the N-well and the p-substrate are held at ground. The block erase mode enables the array to operate similar to a flash EEPROM.

What is claimed is:

1. A non-volatile MOS memory array comprising, an array of cells, each cell having a pair of memory transistors, each pair having an identical mirror-image layout relative to each other upon a substrate that in top projection shows the pair sharing spaced apart, parallel first and second bit lines electrically communicating with source and drain electrodes, each transistor of the pair having a T-shaped conductive floating gate with a first portion of the T-shape above the substrate between the source and drain electrodes and a second portion of the T-shape extending away from the first portion, each second portion capacitively connected to a different word line, perpendicular to the bits lines, the T-shapes aligned with T bases facing each other.

2. The apparatus of claim 1 further defined by means for charging the bit lines with a phased application of voltage first raising one bit line while lowering the other and then vice-versa, the voltage being above a minimum to cause hot electron injection onto the floating gate from source and drain electrodes.

3. The apparatus of claim 1 further defined by means for charging only one of the word lines at one time.

4. The apparatus of claim 1 wherein portions of each floating gate form a plate of a capacitor relative to source and drain electrodes electrically communicating with a word line.

5. In a non-volatile memory array an arrangement of devices comprising,
a semiconductor substrate,
spaced apart word lines running in a first direction within the substrate,
spaced apart, phased bit lines running in a second direction orthogonal to the first direction within the substrate and intersecting the word lines, forming a tic-tac-toe pattern having a central zone,
a pair of mirror-image MOS transistors within said central zone, said transistors having spaced apart sources and drains separated by a channel within the substrate and a T-shaped floating gate spaced above the substrate and over the channel, at least one of the sources and drains communicating electric charge to one of the floating gates by band-to-band tunneling, each floating gate having a second portion of the T-shaped floating gate capacitively coupled to a word line, the two floating gates having mutually facing first portions.

6. The array of claim 5 wherein the floating gate is part of a layer of poly having a T-shape.

7. The array of claim 6 wherein said T-shape has a T-top and a T-base and wherein said single layer of poly is part of the T-base.

8. The array of claim 5 wherein said pair of mirror-image transistors are mirrored across an imaginary line parallel to the word lines and midway therebetween.

9. The array of claim 8 wherein each transistor has a source, gate, drain cross-section parallel to said imaginary line.

10. The array of claim 6 having only a single layer of poly.

11. A memory array of non-volatile memory transistors comprising, pairs of word lines intersecting pairs of bit lines, the intersections establishing tic-tac-toe patterns having a central zone, pairs of mirror-image MOS transistors within each central zone, said transistors having spaced apart sources and drains separated by a channel and an T-shaped associated floating gate over the channel, at least one of the sources and drains of each transistor communicating electric charge to the associated floating gates by band-to-band tunneling, each transistor of the pair having a second portion of its T-shaped floating gate capacitively connected to a respective word line and the two floating gates having mutually facing first portions.

\* \* \* \* \*